United States Patent
Lund

(10) Patent No.: US 10,177,183 B2
(45) Date of Patent: Jan. 8, 2019

(54) EMBEDDED ORIENTATION MARKERS FOR IMAGING SENSORS

(71) Applicant: Sensors Unlimited, Inc., Princeton, NJ (US)

(72) Inventor: Joshua Lund, Dallas, TX (US)

(73) Assignee: Sensors Unlimited, Inc., Princeton, NJ (US)

(*) Notice: Subject to any disclaimer, the term of this patent is extended or adjusted under 35 U.S.C. 154(b) by 0 days.

(21) Appl. No.: 15/259,479

(22) Filed: Sep. 8, 2016

(65) Prior Publication Data
US 2018/0069042 A1    Mar. 8, 2018

(51) Int. Cl.
H01L 27/146    (2006.01)
G06T 1/00      (2006.01)
H04N 1/32      (2006.01)
H04N 5/369     (2011.01)

(52) U.S. Cl.
CPC ...... *H01L 27/14605* (2013.01); *G06T 1/0021* (2013.01); *H04N 1/32267* (2013.01); *H04N 5/3696* (2013.01); *G06T 2200/28* (2013.01)

(58) Field of Classification Search
None
See application file for complete search history.

(56) References Cited

U.S. PATENT DOCUMENTS

| | | | | |
|---|---|---|---|---|
| 6,354,737 | B1* | 3/2002 | Hufe | G01N 23/04 235/462.01 |
| 6,804,373 | B1* | 10/2004 | Tresser | G06T 1/0042 358/3.06 |
| 7,697,716 | B2 | 4/2010 | Miller et al. | |
| 7,724,260 | B2 | 5/2010 | Hancock et al. | |
| 8,224,024 | B2* | 7/2012 | Foxlin | G06T 7/73 348/135 |
| 8,401,256 | B2 | 3/2013 | Warp | |
| 8,457,346 | B2 | 6/2013 | Rodriguez et al. | |
| 2002/0090109 | A1* | 7/2002 | Wendt | G06T 1/0071 382/100 |
| 2011/0194728 | A1* | 8/2011 | Kutcka | G02B 27/26 382/100 |
| 2012/0273564 | A1* | 11/2012 | Mercolino | G07D 7/004 235/375 |
| 2014/0270331 | A1* | 9/2014 | Zhao | G06T 1/005 382/100 |
| 2015/0248603 | A1* | 9/2015 | Lowenthal | G06K 19/06112 235/375 |

OTHER PUBLICATIONS

Dunn et al., "Grid Labeling using a Marked Grid," SPIE vol. 1005 Optics, Illumination, and Image Sensing for Machine Vision III, 1988.*
Keizer et al., "Marked Grid Labeling," in IEEE Proceedings of Computer Vision and Pattern Recognition, 1989.*

* cited by examiner

*Primary Examiner* — Soo Shin
(74) *Attorney, Agent, or Firm* — Locke Lord LLP; Scott D. Wofsy; Joshua L. Jones

(57) ABSTRACT

An imaging sensor includes an imaging array with a plurality of pixels. A sub-set of the pixels are marker pixels configured to each provide a constant respective output value to embed an orientation and alignment marker in images produced with the imaging array. The marker pixels can be sparsely distributed across the imaging array.

20 Claims, 1 Drawing Sheet

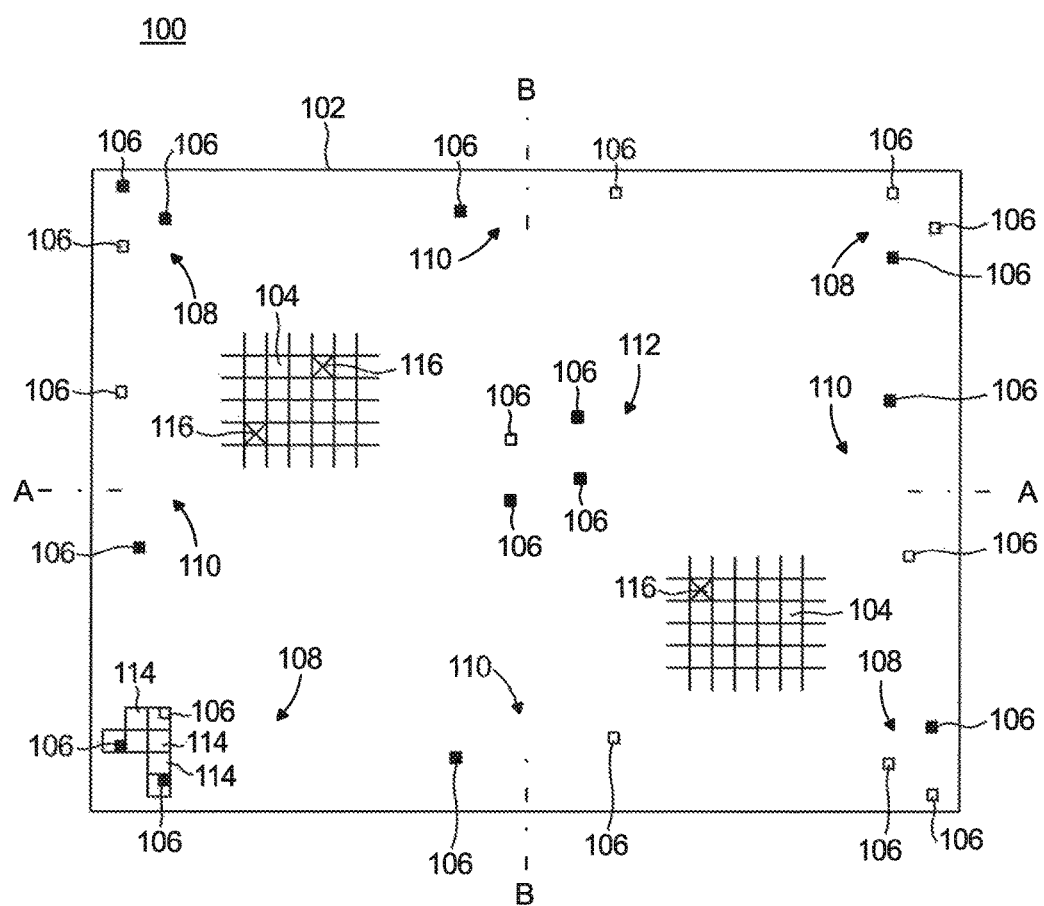

EMBEDDED ORIENTATION MARKERS FOR IMAGING SENSORS

BACKGROUND OF THE INVENTION

1. Field of the Invention

The present disclosure relates to imaging devices and techniques, and more particularly to watermarking digital images.

2. Description of Related Art

Some applications that utilize imaging sensors, for example in aerospace, require an extreme degree of certainty that the imaging sensor is both functioning correctly and oriented as expected. Confirmation is required to make sure images from an image sensor are not mirrored, rotated, or corrupted (e.g., stretched or the like). One conventional method to provide this validation has been to put custom physical orientation markers, e.g., digital watermarks, in the image sensor pixel array. Such custom sensors can help with the verification, but add to the cost and complication of imaging. Moreover orientation markers, e.g., arrow or X-shapes physically present in the pixel array, represent portions of the pixel array that must be cropped or masked out of images formed by the imaging sensor to avoid corrupt images.

The conventional techniques have been considered satisfactory for their intended purpose. However, there is an ever present need for improved orientation marking. This disclosure provides a solution for this problem.

SUMMARY OF THE INVENTION

An imaging sensor includes an imaging array with a plurality of pixels. A sub-set of the pixels are marker pixels configured to each provide a constant respective output value to embed an orientation and alignment marker in images produced with the imaging array. The constant respective output level is either lower than the lowest level output from an active pixel or higher than the highest level output from an active pixel The sub-set of pixels can be arranged in a pre-determined pattern. The predetermined pattern can be asymmetrical about at least one axis across the imaging array. The predetermined pattern can be asymmetrical about each of two orthogonal axes across the imaging array. The predetermined pattern can be rotationally asymmetrical.

The predetermined pattern can include marker pixels spanning four corners of the imaging array. The predetermined pattern can include marker pixels proximate four edges of the imaging array between corners of the imaging array. The predetermined pattern can include marker pixels in a central region of the imaging sensor spaced apart from corners and edges of the imaging sensor.

The marker pixels can be sparsely distributed across the imaging array. The marker pixels can be spaced apart from one another so no two marker pixels are adjacent to one another in the imaging array. Each of the marker pixels can be spaced apart by several pixel pitches from any other marker pixels.

The marker pixels can include a plurality of black marker pixels that are set to output a 0% signal. The marker pixels can include a plurality of dark pixels that are set to output a 0%-50% signal, inclusive. The marker pixels can include a plurality of white pixels that are set to output a 100% signal. The marker pixels can include a plurality of light pixels that are set to output a 50%-100% signal, inclusive. It is also contemplated that the marker pixels can output a value that is below the 0% signal level or above the 100% signal level of a normal pixel. The imaging array can include a plurality of defective pixels, wherein the sum of the defective pixels and the marker pixels is less than 99.97% of the number of total pixels in the imaging array.

A method of imaging includes capturing imaging data from an imaging sensor wherein the imaging data includes set output value data for a plurality of marker pixels sparsely distributed throughout an imaging array. The imaging data can be compared to an expected pattern to determine position of the set output value data in the imaging data. The method also includes replacing the set output value data with nearest neighbor data to remove an orientation and alignment marker physically present in the imaging array.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, preferred embodiments thereof will be described in detail herein below with reference to certain FIGURES, wherein:

FIG. 1 is a schematic view of an exemplary embodiment of an imaging sensor constructed in accordance with the present disclosure, showing the pattern of marker pixels for embedding orientation and alignment markers in images.

DETAILED DESCRIPTION OF THE PREFERRED EMBODIMENTS

Reference will now be made to the drawings wherein like reference numerals identify similar structural features or aspects of the subject disclosure. For purposes of explanation and illustration, and not limitation, a partial view of an exemplary embodiment of an imaging sensor in accordance with the disclosure is shown in FIG. 1 and is designated generally by reference character 100. The systems and methods described herein can be used to embed orientation and alignment markers in images, e.g., for purposes of verifying imaging sensor orientation, quality, and the like.

Imaging sensor 100 includes an imaging array 102 with a plurality of pixels 104. FIG. 1 is schematic, so for sake of clarity, not all of the pixels 104 are shown, however, those skilled in the art will readily appreciate that the rectangular surface of imaging array 102 is tiled over with pixels 104. A sub-set of the pixels 104 are marker pixels 106 configured to each provide a constant respective output value to embed an orientation and alignment marker in images produced with the imaging array 102.

The sub-set of pixels 106 is arranged in a pre-determined pattern, e.g., that can be used for an entire production line of imaging sensors 100. The predetermined pattern is asymmetrical about each of two orthogonal axes A and B that extend across the imaging array 102. In other words, the predetermined pattern of marker pixels 106 is asymmetrical in the vertical direction about axis A, and asymmetrical in a horizontal direction about axis B as oriented in FIG. 1. The predetermined pattern is also rotationally asymmetrical.

This means that it can be determined whether an image with digitally embedded orientation and alignment markers with the predetermined pattern is mirrored in the vertical and/or horizontal axis, and it can be determined at what rotational orientation the image is, whether the image is rotated 0°, 90°, 180°, or 270° in the clockwise direction.

The predetermined pattern includes marker pixels 106 spanning the four corners 108 of the imaging array 102. The predetermined pattern also includes marker pixels 106 proximate four edges 110 of the imaging array 102 between corners 108 of the imaging array 102. The predetermined pattern also includes marker pixels 106 in a central region 112 of the imaging sensor 102 spaced apart from the corners 108 and the edges 110 of the imaging sensor 112. Thus the orientation and alignment marker resulting from marker pixels 106 can be used to determine if images from imaging sensor 100 are distorted, e.g., stretched.

The marker pixels 106 are sparsely distributed across the imaging array 102. The marker pixels 106 are spaced apart from one another so no two marker pixels 106 are adjacent to one another in the imaging array 102. Each of the marker pixels 106 can be spaced apart by several pixel pitches from any other marker pixels 106. A pixel pitch is the spacing from the center of one pixel to the center of an adjacent pixel. In FIG. 1 only a few pixel marker groupings 114 are shown, however, those skilled in the art will readily appreciate that each pixel 104 and 106 is in a marker grouping, e.g., each pixel marker grouping 114 can include a single photodetector or multiple photodetectors for multiband imagery, color imagery, or the like, and only one photodetector in a marker grouping 114 necessarily need be set to a predetermined output value to provide a marker pixel 106.

The marker pixels 106 can include a plurality of black marker pixels, e.g. the filled in marker pixels 106 in FIG. 1, that are set to output a 0% signal. A marker pixel set to output 0% signal level may output a lower signal level than an active pixel with no incident photocurrent. For example, the minimum signal from an active pixel, i.e., one of the normal pixels that is not a marker pixel, might be 3%.

In addition to or in lieu of black marker pixels, the marker pixels 106 can include a plurality of dark pixels that are set to output a 0%-50% signal, inclusive. The marker pixels 106 also include a plurality of white pixels, e.g., the marker pixels 106 that are not filled in FIG. 1, that are set to output a 100% signal. A marker pixel set to output 100% signal level may output a higher signal level than an active pixel with no incident photocurrent. For example, the maximum signal from an active pixel, i.e., one of the normal, functional pixels 104 that is not a marker pixel, might be 95%. In addition to or in lieu of white marker pixels, the marker pixels 106 can include a plurality of light pixels that are set to output a 50%-100% signal, inclusive. Those skilled in the art will readily appreciate that the specific pattern shown in FIG. 1 is exemplary only, and that any other suitable pattern consistent with the principles disclosed herein can be used without departing from the scope of this disclosure.

It is also contemplated that the marker pixels 106 can output a value that is below the 0% signal level or above the 100% signal level of a normal, active pixel. This allows for discerning more definitively that a pixel is a marker versus an active pixel with a true signal level similar to a marker. This happens, for example, if a marker pixel is held at a reset voltage while active pixels are allowed to integrate signal. Active pixels receiving zero photocurrent will still integrate some signal and will be at a higher output level than the marker pixels 106.

The imaging array 102 can include a plurality of defective pixels 116, indicated with x's in FIG. 1, wherein the sum of the defective pixels 116 and the marker pixels 106 is less than some threshold percentage, for example 0.03%, of the number of total pixels 104 in the imaging array 102, or less than any other suitable standard percentage for acceptable defective pixels for a given production run. In the example shown in FIG. 1, there are 24 marker pixels 106. So in a 1280 by 1024 imaging array, for example, where the requirement is for 99.97% of the pixels to not be defective, there can be a total of 393 defective pixels plus marker pixels. The 24 marker pixels 106 are therefore a small fraction of the total non-functional pixels permitted and it is not difficult to accommodate this small fraction in design and manufacture.

A method of imaging includes capturing imaging data from an imaging sensor, e.g., imaging sensor 100, wherein the imaging data includes set output value data for a plurality of marker pixels, e.g., marker pixels 106, sparsely distributed throughout an imaging array, e.g. imaging array 102. The imaging data can be compared to an expected pattern to determine position of the set output value data in the imaging data. The method also includes replacing the set output value data with nearest neighbor data to remove an orientation and alignment marker physically present in the imaging array. For example, in an image formed with imaging array 102, for each marker pixel 106, values from the nearest neighboring non-marker pixels 104 can be averaged and that average can replace the data for the respective marker pixel 106.

Unlike conventional watermarks that use several adjacent marker pixels, e.g., in an X shape or in an arrow shape, to verify imaging array orientation and functionality, the predetermined patterns disclosed herein are substantially non-destructive and to not require masking or cropping to avoid corrupt images. Using a sparse pattern of on-adjacent pixel markers as disclosed herein for orientation verification can make it possible to embed the same pattern of pixel markers in all imaging sensors in a product line instead of requiring application of specific customizations, which can be relatively expensive and can make for difficult supply chain management.

Traditional watermarking techniques used subtle changes or value offsets, superimposed on image data, where the image data is still expected to be present and only mildly affected. To detect or extract these subtle changes requires image statistics, multiple frame analysis, and involved processing to extract the watermark. Embodiments described herein take advantage of the fact that it is acceptable in some imaging technologies to substitute defective pixels. The watermark created in embodiments disclosed herein uses pixel values outside of the range of a functional or active pixel, which is acceptable because no useful image data is expected to come from the watermark pixels. Since the pixel values are outside the range of a functional or active pixel, no image statistics are required and the watermark can be detected in one frame with simple compare processing.

Marker pixels 106 are spaced apart so that they do not cause imaging array 102 to fail inoperable cluster requirements. The net result is that the marker pixels 106 can be present in every imaging sensor 102 in a production line and can be identified and replaced in images using the same techniques used for random defects in conventional imaging sensors, but can be used as a functionality and orientation indicator in sensors.

The methods and systems of the present disclosure, as described above and shown in the drawings, provide for imaging sensors with superior properties including effective embedding of orientation and alignment markers that can be used for sensor validation. While the apparatus and methods of the subject disclosure have been shown and described with reference to preferred embodiments, those skilled in the art will readily appreciate that changes and/or modifications may be made thereto without departing from the scope of the subject disclosure.

What is claimed is:

1. An imaging sensor comprising:
an imaging array with a plurality of pixels, wherein a first sub-set of the pixels are integrating active photodetector pixels, wherein a second sub-set of the pixels are non-integrating marker pixels configured to each provide a constant respective output value to embed an orientation and alignment marker in images produced with the imaging array, wherein the marker pixels are spaced apart from one another so no two marker pixels are adjacent to one another in the imaging array.

2. The imaging sensor as recited in claim 1, wherein the second sub-set of pixels are arranged in a predetermined pattern.

3. The imaging sensor as recited in claim 2, wherein the predetermined pattern is asymmetrical about at least one axis across the imaging array.

4. The imaging sensor as recited in claim 2, wherein the predetermined pattern is asymmetrical about each of two orthogonal axes across the imaging array.

5. The imaging sensor as recited in claim 2, wherein the predetermined pattern is rotationally asymmetrical.

6. The imaging sensor as recited in claim 2, wherein the predetermined pattern includes marker pixels spanning four corners of the imaging array.

7. The imaging sensor as recited in claim 2, wherein the predetermined pattern includes marker pixels proximate four edges of the imaging array between corners of the imaging array.

8. The imaging sensor as recited in claim 2, wherein the predetermined pattern includes marker pixels in a central region of the imaging sensor spaced apart from corners and edges of the imaging sensor.

9. The imaging sensor as recited in claim 2, wherein the predetermined pattern includes marker pixels spanning four corners of the imaging array, wherein the predetermined pattern includes marker pixels proximate four edges of the imaging array each between two corners of the imaging array, and wherein the predetermined pattern includes marker pixels in a central region of the imaging sensor spaced apart from corners and edges of the imaging sensor.

10. The imaging sensor as recited in claim 1, wherein the marker pixels are sparsely distributed across the imaging array.

11. The imaging sensor as recited in claim 1, wherein each of the marker pixels is spaced apart by several pixel pitches from any other marker pixels.

12. The imaging sensor as recited in claim 1, wherein the marker pixels include a plurality of dark pixels that are set to output a 0%-50% signal, inclusive.

13. The imaging sensor as recited in claim 1, wherein the marker pixels include a plurality of white pixels that are set to output a 100% signal.

14. The imaging sensor as recited in claim 1, wherein the marker pixels include a plurality of light pixels that are set to output a 50%-100% signal, inclusive.

15. The imaging sensor as recited in claim 1, wherein the imaging array includes a plurality of defective pixels, wherein the sum of the defective pixels and the marker pixels is less than 99.97% of the number of total pixels in the imaging array.

16. The imaging sensor as recited in claim 1, wherein the constant respective output level is either lower than the lowest level output from the active pixels of the imaging array or higher than the highest level output from the active pixels of the imaging array.

17. An imaging sensor comprising:
an imaging array with a plurality of pixels, wherein a first sub-set of the pixels are Integrating active photodetector pixels, wherein a second sub-set of the pixels are non-integrating marker pixels configured to each provide a constant respective output value to embed an orientation and alignment marker in images produced with the imaging array;
wherein the second sub-set of pixels are arranged in a predetermined pattern that includes marker pixels spanning four corners of the imaging array;
wherein the predetermined pattern is asymmetrical about each of two orthogonal axes across the imaging array; and
wherein the predetermined pattern is rotationally asymmetrical, wherein the marker pixels are spaced apart from one another so no two marker pixels are adjacent to one another in the imaging array.

18. The imaging sensor as recited in claim 17, wherein each of the marker pixels is spaced apart by several pixel pitches from any other marker pixels.

19. A method of imaging comprising:
capturing imaging data from an imaging sensor wherein the imaging data includes set output value data for a plurality of pixels, wherein a first sub-set of the pixels are integrating active photodetector pixels, wherein a second sub-set of the pixels are non-integrating marker pixels sparsely distributed throughout an imaging array, wherein the marker pixels are spaced apart from one another so no two marker pixels are adjacent to one another in the imaging array; and
replacing the set output value data with nearest neighbor data to remove the imaging data received from an orientation and alignment marker physically present in the imaging array.

20. The method as recited in claim 19, further comprising comparing the imaging data to an expected pattern to determine position of the set output value data in the imaging data.

* * * * *